(12) United States Patent
Schrems (10) Patent No.: US 6,265,741 B1
(45) Date of Patent: *Jul. 24, 2001

(54) TRENCH CAPACITOR WITH EPI BURIED LAYER

(75) Inventor: Martin Schrems, Langebrueck (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 09/056,119

(22) Filed: Apr. 6, 1998

(51) Int. Cl.[7] .................. H01L 27/108; H01L 29/76; H01L 29/94; H01L 31/119
(52) U.S. Cl. ............................ 257/301; 257/296
(58) Field of Search ................... 257/300–310; 438/243–253

(56) References Cited

U.S. PATENT DOCUMENTS

| 5,629,226 | * | 5/1997 | Ohtsuki ........................... 257/301 |
| 5,731,226 | * | 3/1998 | Lin et al. ........................ 438/607 |
| 5,945,704 | * | 8/1999 | Schrems et al. ................. 257/301 |

FOREIGN PATENT DOCUMENTS

| 36310235A | * | 5/1988 | (JP) . |
| 363102351A | | 5/1998 | (JP) ................... H01L/27/04 |

* cited by examiner

Primary Examiner—Minh Loan Tran
Assistant Examiner—Cuong Q Nguyen
(74) Attorney, Agent, or Firm—Stanton C. Braden, Esq.

(57) ABSTRACT

A trench capacitor with an epitaxial layer in the lower portion of the trench. The epitaxial layer may be doped to serve as a buried plate.

8 Claims, 9 Drawing Sheets

TRENCH CAPACITOR WITH EPI BURIED LAYER

FIELD OF INVENTION

The invention generally relates to device and device fabrication and, more particularly, to a trench capacitor.

BACKGROUND OF INVENTION

Integrated circuits (ICs) or chips employ capacitors for charge storage purposes. An example of an IC that employs capacitors for storing charge is a memory IC, such as a dynamic random access memory (DRAM) chip. The level of the charge ("0" or "1") in the capacitor represents a bit of data.

A DRAM chip includes an array of memory cells interconnected by rows and columns. Typically, the row and column connections are referred to as wordlines and bitlines, respectively. Reading data from or writing data to the memory cells is accomplished by activating the appropriate wordlines and bitlines.

Typically, a DRAM memory cell comprises a transistor connected to a capacitor. The transistor includes two diffusion regions separated by a channel, above which is located a gate. Depending on the direction of current flow between the diffusion region, one is referred to as the drain and the other the source. The terms "drain" and "source" are herein used interchangeably to refer to the diffusion regions. The gate is coupled to a wordline and one of the diffusion regions is coupled to a bitline. The other diffusion region is coupled to the capacitor. Applying an appropriate voltage to the gate switches the transistor on, enabling current to flow through channel between the diffusion regions to form a connection between the capacitor and bitline. Switching off the transistor severs this connection by preventing current flowing through the channel.

One type of capacitor that is commonly employed in DRAMs is the trench capacitor. A trench capacitor is a three-dimensional structure formed in the substrate. Typically, a trench capacitor comprises a deep trench etched into the substrate. The trench is filled, for example, with n-type doped poly. The doped poly serves as one electrode of the capacitor (referred to as the storage node). An n-type doped region surrounds the lower portion of the trench, serving as a second electrode. The doped region is referred to as a "buried plate."

A conventional technique for forming the buried plate includes outdiffusing dopants into region of the substrate surrounding the lower portion of the trench. The dopant source is typically provided by a doped silicate glass such as, for example, arsenic doped silicate glass (ASG). ASG is formed from TEOS and organic precursors such as TEAS or TEOA. Such precursors, however, are difficult to deliver into a low pressure chemical vapor deposition (LPCVD) system which results in bad wafer uniformity due wafer depletion. To compensate for bad wafer uniformity, smaller batch sizes are used as compared to other LPCVD processes. Furthermore, the ASG the precursors are relatively expensive. These two factors create a high cost of ownership for the ASG deposition process.

The formation of the buried plate using ASG requires a number of complicated processing steps to integrate the ASG process into the flow of process steps for DRAM manufacturing. This also contributes to an increase in cost as well as increase risk of yield loss.

Fabricating ICs on p-/p+ substrates is sometimes desirable as their use result in increased yields. p-/p+ substrates, for example, provide protection against latch-up. Furthermore, p-/p+ substrates provide better gathering capabilities for metal impurities and are more resistant against thermal wafer distortion than p- substrates. However, conventional trench capacitors with buried plate are not compatible with p-/p+ substrates. This is because the dopant concentrations of the n-type buried plate and the p-type substrate are in about the same regime, thereby neutralizing each other. From the forgoing discussion, it is desirable to provide a trench capacitor with an improved buried plate.

SUMMARY OF INVENTION

The invention relates to an improved trench capacitor, such as one employed in a memory cell. In one embodiment, the trench capacitor is employed in a DRAM cell of, for example, a DRAM or an embedded DRAM chip. The trench capacitor comprises an epitaxial layer lining the lower portion of the trench. In one embodiment, the epitaxial (epi) layer is doped to serve as a buried plate of the capacitor. Above the epi buried plate is a dielectric collar. A node dielectric lines the collar and epi buried plate, isolating the storage node of the trench capacitor from the buried plate. An epi spacer layer may be provided to provide separation between the doped epi buried plate and the substrate. In an alternative embodiment, the epi layer is undoped.

DETAILED DESCRIPTION OF THE INVENTION

The present invention relates to ICs in general and, more particularly to trench capacitors. Such ICs includes, for example memory ICs such as random access memories (RAMs), dynamic RAMs (DRAMs), synchronous DRAMs (SDRAMs), static RAMs (SRAMs), and read only memories (ROMs) or other memory ICs. Other ICs include logic devices such as programmable logic arrays (PLAs), application specific ICs (ASICs), merged logic/memory ICs (embedded DRAMs), or any circuit devices.

Typically, a plurality of ICs are fabricated on a semiconductor substrate, such as a silicon wafer, in parallel. After processing, the wafer is diced in order to separate the ICs into a plurality of individual chips. The chips are then packaged into final products for use in, for example, consumer products such as computer systems, cellular phones, personal digital assistants (PDAs), and other products. For purposes of discussion, the invention is described in the context of forming a single cell.

For purposes of discussion, the present invention is described in the context of a DRAM cell. However, the invention extends to formation of trench capacitors in general. To better understand the invention, a description of a conventional DRAM cell employing trench capacitor is provided.

Figure 1:
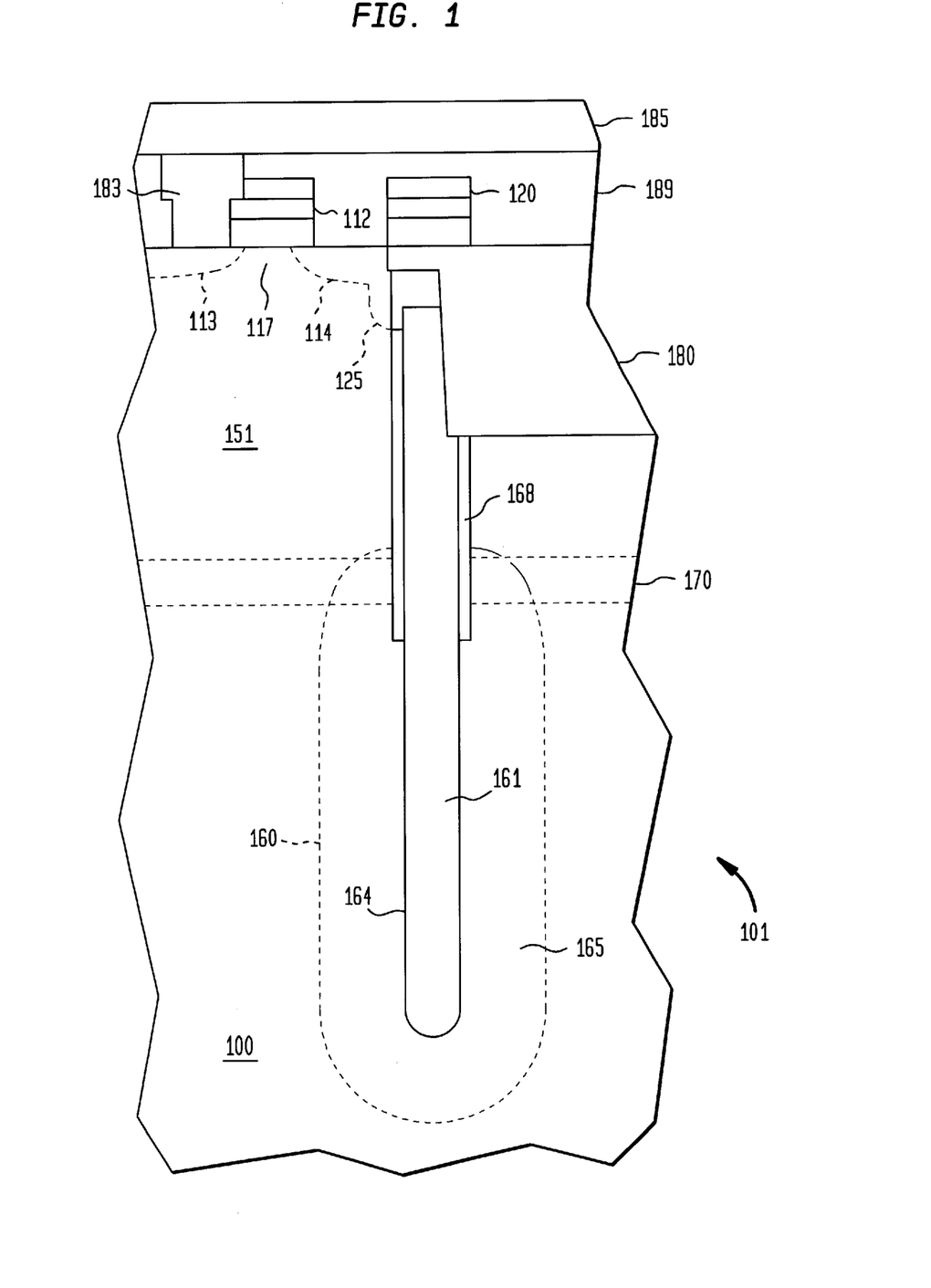
FIG. 1 shows a conventional DRAM cell.

Referring to FIG. 1, a conventional trench capacitor DRAM cell 100 is shown. Such conventional trench capacitor DRAM cell is described in, for example, Nesbit et al., *A 0.6 µm² 256 Mb Trench DRAM Cell With Self-Aligned Buried Strap* (BEST), IEDM 93-627, which is herein incorporated by reference for all purposes. Typically, an array of cells is interconnected by wordlines and bitlines to form a DRAM chip.

The DRAM cell comprises a trench capacitor 160 formed in a substrate 101. The substrate is lightly doped with p-type dopants (p⁻), such as boron (B). The trench is filled with, typically, polysilicon (poly) 161 heavily doped with n-dopants (n⁺), such as arsenic (As) or phosphorous (P). A buried plate 165 doped with, for example, As is provided in the substrate surrounding the lower portion of the trench. The As is diffused into the silicon substrate from a dopant source, such as ASG, that is formed on the sidewalls of the trench. The poly and buried plate serve as the electrodes of the capacitor. A node dielectric 164 separates the electrodes.

The DRAM cell also comprises a transistor 110. The transistor includes gate 112 and diffusion regions 113 and 114. The diffusion regions, which are separated by a channel, are formed by implanting n-type dopants such as phosphorus (P). A node diffusion region 125, referred to as the "node junction," couples the capacitor to the transistor. The node diffusion region is formed by out diffusing dopants from the trench poly through a buried strap 162.

A collar 168 is formed at an upper portion of the trench. As used herein, the upper portion of the trench refers to the section that includes the collar and the lower portion includes the section below the collar. The collar prevents leakage of the node junction to the buried plate. Leakage is undesirable as it degrades the retention time of the cell, increasing the refresh frequency which adversely impacts performance.

A buried well 170 comprising n-type dopants, such as P or As, is provided below the surface of the substrate. The peak concentration of dopants in the buried n-well is at about the bottom of the collar. Typically, the well is lightly doped compared to the buried plate. The buried well serves to connect the buried plates of the DRAM cells in the array.

Activation of the transistor by providing the appropriate voltages at the gate and bitline accesses the trench capacitor. Generally, the gate forms a wordline and the diffusion region 113 is coupled to a bitline 185 in the DRAM array via a contact 183. The bitline 185 is isolated from the diffusion region by an interlevel dielectric layer 189.

A shallow trench isolation (STI) 180 is provided to isolate the DRAM cell from other cells or devices. As shown, a wordline 120, is formed over the trench and isolated therefrom by the STI. Wordline 120 is referred to as the "passing wordline." Such a configuration is referred to as a folded bitline architecture.

Figure 2A:
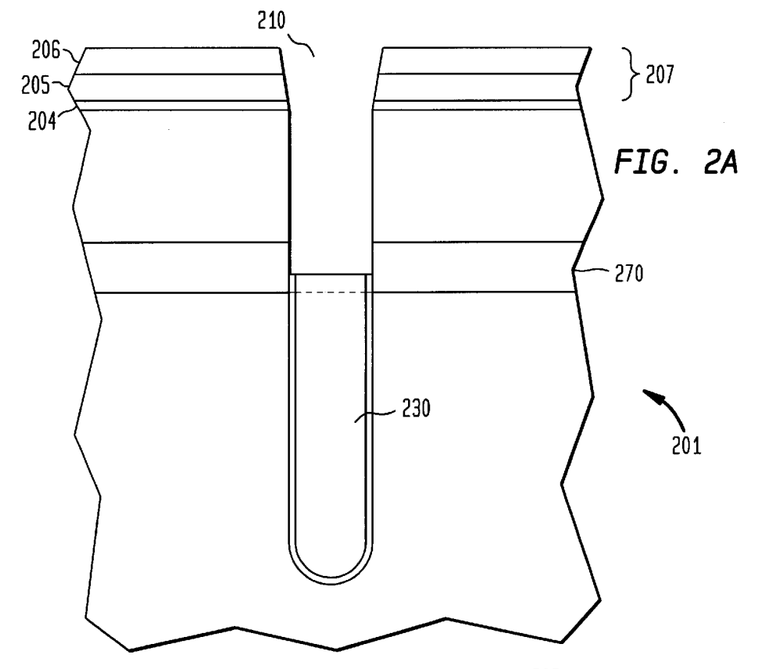
FIGS. 2a–b show a conventional process for forming a buried plate in a DRAM cell.

FIGS. 2a–c show a conventional process for forming a buried plate of a DRAM cell. Referring to FIG. 2a, a pad stack 207 is formed on the surface of the substrate 201. The pad stack comprises various layers such as a pad oxide 204 and pad stop layer 205 such as nitride. The pad stack also includes a hard mask layer 206 formed above the pad stop layer. The hard mask serves as an etch mask for forming the trench. The pad stack is patterned using conventional lithographic techniques to define a region in which a trench 210 is to be formed.

Formation of the trench is accomplished by an anisotropic etch such as reactive ion etching (RIE). The trench is then lined with an ASG layer 220, serving as a dopant source for forming the buried plate. A thin TEOS layer may be formed over the ASG to ensure that there is good adhesion with a deposited resist layer 230 that fills the trench. The resist is recessed, exposing the ASG layer in the upper portion of the trench. The exposed ASG is removed by a wet etch process.

Figure 2B:
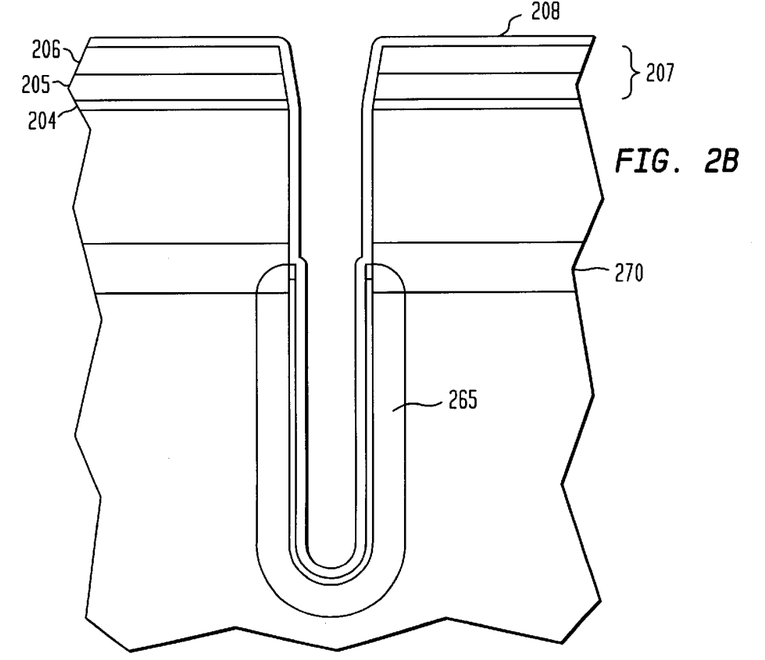

Referring to FIG. 2b, the remaining portion of the resist is removed from the trench selective to the ASG. A dielectric layer 208 comprising, for example, TEOS is deposited over the trench. The TEOS layer prevents As from autodoping the exposed upper portion of the silicon sidewalls. An anneal is performed to outdiffuse the As from the ASG into the silicon, creating a buried plate 265. The top portion of the buried plate contacts a buried n-well 270. After the formation of the buried plate, the remaining portion of the DRAM is fabricated to result in, for example, a DRAM cell as shown in FIG. 1.

Figure 3:
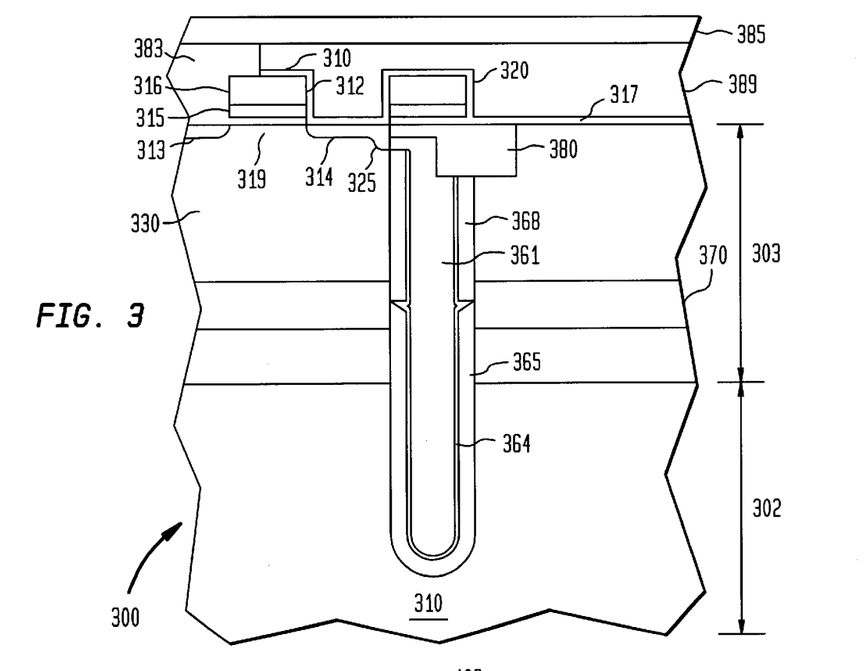
FIG. 3 shows a DRAM cell in accordance with one embodiment of the invention.

FIG. 3 shows an embodiment of the invention. As shown, a DRAM cell 300 includes a trench capacitor 310. Illustratively, the DRAM cell is a merged isolation node trench (MINT) cell. Other trench cell configurations that employ a buried plate are also useful. For a 256 megabit DRAM chip using 0.25 µm design rules, the dimensions of the trench capacitor is about 7–8 µm deep, 0.25 µm wide and 0.50 µm long with a unit cell dimension of about 0.605 µm². Of course, the dimensions can vary depending on design requirements and design rules.

As shown, the trench capacitor is formed in a substrate 301 such as a silicon wafer. The substrate, for example, is lightly doped with dopants having a first electrical type. The first electrical type may be p-type and includes dopants such as B. A heavily doped substrate, such as a P+ substrate, may also be useful. The substrate, for example, comprises a p−/p+ epi substrate. The p−/p+ epi substrate includes a lightly doped (p−) epi portion 303 and a heavily doped (p+) portion substrate 303. The p+ epi portion is typically about 2–3 µm thick.

A p-type well 330 (p-well) isolates the array devices from the substrate to reduce leakage currents. The concentration of the p-well is about $5 \times 10^{17}$–$8 \times 10^{17}$ cm⁻³.

Typically, the trench comprises poly 361 heavily doped with dopants having a second electrical type. The poly is heavily doped with, for example, n-type dopants (n⁺) such as As or P. In one embodiment, the poly is heavily doped with As. The concentration of As is about $1$–$2 \times 10^{19}$ cm⁻³.

In accordance with one embodiment of the invention, an epitaxial silicon (epi) layer 365 lines the lower portion of the trench, that is the portion of the trench below collar 368. Alternatively, the epi layer 365 may comprise a plurality of epi layers. The epi serves as the buried plate of the capacitor.

The epi layer starts, for example, at about 1.2 µm below the substrate surface. This distance depends on the lower collar edge. In one embodiment, the epi layer is doped with dopants having the same electrical type as poly 361. The epi is doped, for example, with n-type dopants such as As or P. The concentration of As is, for example, about $1 \times 10^{19}$ cm⁻³ and the concentration of P is, for example, about $2 \times 10^{19}$ cm⁻³. Higher concentrations are also useful. An undoped epi layer is also useful.

A node dielectric layer 364 separates the electrodes of the capacitor. In one embodiment, the dielectric layer comprises nitride/oxide. Oxide/nitride/oxide or other suitable dielectric layer of stack of layers such as oxide, nitridized oxide, or NONO are also useful.

Connecting the epi buried plate 365 of the capacitor with other capacitors within the DRAM array is a buried well 370 comprising dopants of second conductivity. In one embodiment, the buried well formed by implanting n-type dopants, such as As or P. The concentration of the well is typically about $1\times10^{17}$–$1\times10^{20}$ cm$^{-3}$. The buried well may also be formed with an n-type epi layer and is connected to a reference voltage. By connecting the buried plates of the capacitors in the DRAM array to a common reference voltage, the maximum electric field in the dielectric layer is minimized, thus improving reliability. In one embodiment, the reference voltage is midway between the bitline low and high voltage limits, commonly referred to as $V_{DD}/2$. Other reference voltage such as ground is also useful.

A strap 362 is provided above the doped poly. Dopants from the doped poly 361 outdiffuse into the silicon, forming a node diffusion region 325 or node junction to couple the transistor and capacitor. Although the illustrative embodiment is described with a buried strap, the use of other types of coupling such as a surface strap is also useful.

A collar is provided in the upper portion of the trench and extends to about the top of the buried plate. As shown, the collar is slightly recessed below the substrate surface to accommodate a buried strap 362. The collar comprises a dielectric material. In one embodiment, a thermal oxide layer is first formed and then a TEOS layer is deposited thereon. The collar prevents or reduces leakage from the node junction to the buried plate. In one embodiment, the collar is about 1.2 $\mu$m deep and 20–90 nm thick.

An STI 380 is provided in a top portion the trench to isolate the DRAM cell from other cells in the array and to prevent strap formation between adjacent capacitors. As shown, the STI overlaps a portion of the trench, leaving a remaining portion to permit current to flow between the transistor and capacitor. In one embodiment, the STI nominally overlaps about half the trench width. The STI prevents or reduces strap to strap leakage. The depth of the STI is about 0.25 $\mu$m.

The transistor 311 comprises a gate stack 312 and drain/source diffusion regions 313 and 314 separated by a channel region 319. The diffusion regions comprise n-type dopants, such as As or P. Diffusion region 314 is coupled to the node junction 325. The gate stack, also referred to as the "wordline," comprises poly 315 layer. Typically, the poly is doped with either n or p-type dopants. Optionally, a metal silicide layer (not shown) is formed over the poly layer to reduce sheet resistance of the gate stack. The poly and silicide are sometimes referred to as "polycide."

As shown, the gate stack is capped with a nitride layer 316 that is used as an etch mask for isolating the wordline. Additionally, sidewall oxide (not shown) and a liner 317 are used to isolate the wordline. The liner, for example, comprises nitride or other suitable material. The liner also serves as an etch stop during the formation of a borderless contact 383. The borderless contact provides a connection between diffusion 313 and a bitline 385. A dielectric layer 389, such as BPSG or other dielectric materials such as oxide, isolates the bitline from the diffusion regions. Typically, a barrier or liner layer (not shown) lines the contact opening to isolate the contact stud from the gate.

A passing wordline 320 is formed above a STI 380. The passing wordline is isolated from the trench by the STI and a thick cap oxide. In one embodiment, the edges of the passing wordline are substantially aligned with the trench sidewalls. Such configuration is referred to as a folded bitline architecture. Other configurations such as, for example, open or open-folded architecture are also useful. Additionally, other cell designs using, for example, vertical transistors, are also useful.

As described, the first electrical type is p-type and the second electrical type is n-type. The invention is also applicable to trench capacitors having p-type poly formed in an n-type substrate. Further, it is possible to heavily or lightly dope the substrate, wells, buried plate, and other elements of the DRAM cell with impurity atoms to achieve the desired electrical characteristics.

As described in FIG. 3, the trench capacitor includes a buried plate formed with an epi layer or a plurality of epi layers. The epi layer or layers, for example, are selectively formed on the lower portion of the trench. The use of a epi buried plate, among other advantages, enables the use of a p−/p+ substrate which results in improved yields. For example, p−/p+ substrates reduce latch, reduce wafer warpage, and improve internal guttering of impurities. In one embodiment, the collar of the trench capacitor is formed prior to the selective epi growth and node dielectric deposition. Forming the collar prior to the selective epi growth advantageously provides a buried-plate that is self-aligned to the collar.

Figure 4A:
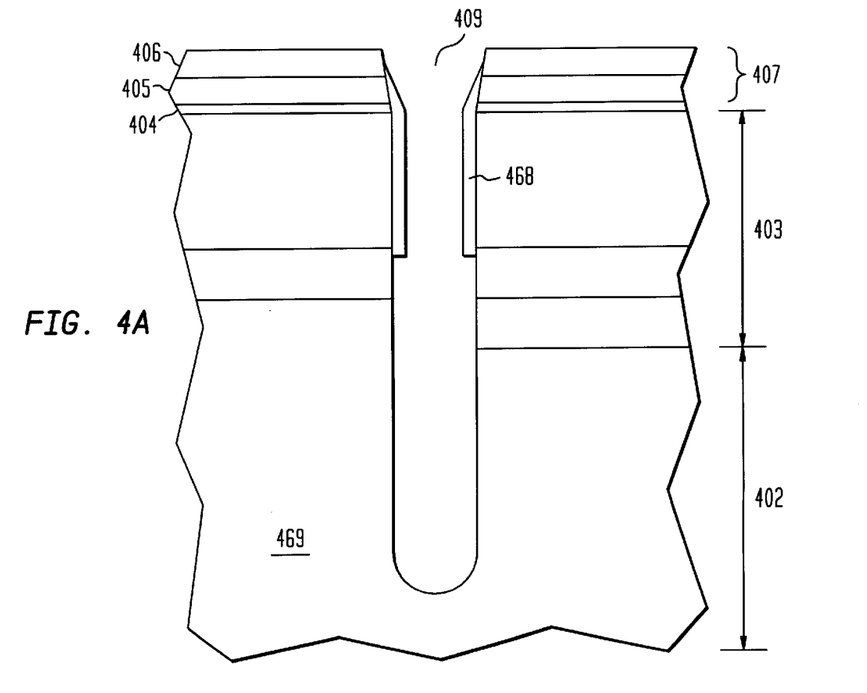
FIGS. 4a–f show a process in accordance with one embodiment of the invention for forming the DRAM cell of FIG. 3.

FIGS. 4a–f show the process for forming a DRAM cell in accordance with an embodiment of the invention using a two step trench etch process. Referring to FIG. 4a, a substrate 401 is provided on which the DRAM cell is fabricated. The substrate, for example, comprises silicon. Other semiconductor substrates are also useful. Typically, the substrate is lightly doped with, for example, p-type dopants (p−) such as B. The concentration of the B is about 1–$2\times10^{16}$ cm$^{-3}$. Higher concentrations of B, which forms a heavily doped p-type (p+) substrate, are also useful. In particular, a p−/p+ epi substrate is useful. Such substrates, for example, comprises a p− epi portion 302 and a p+ substrate 303. Typically, epi portion is about 2–3 $\mu$m thick with a dopant concentration of about $10^{18}$–$10^{20}$ cm$^{-3}$. To avoid outdiffusion of dopants in p+ or p−/p+ substrates, the backside of the wafer may be sealed with an oxide layer formed by a low temperature oxide (LTO) deposition process.

The substrate may also include an n-type buried well 470. The buried well comprises P or As dopants. In one embodiment, a mask is patterned to define the buried well regions. N-type dopants, such as P, are implanted into the buried well regions of the substrate. Typically, the buried well regions are located below the array devices but not the support devices. The implant is performed with sufficient energy and dose to deposit the peak concentration of P dopants in the bottom region of a collar that is formed. The buried well serves to isolate the p-well from the substrate and also forms a conductive bridge between the epi-plates. The concentration and energy of the implant is about >$1\times10^{13}$ cm$^{-2}$ at about 1.5 MeV. Alternatively, the buried well is formed by implanting and then growing an epi layer above the substrate surface. Such technique is described in U.S. Pat. No. 5,250,829 to Bronner et al., which is herein incorporated by reference for all purposes.

Typically, a pad stack 407 is formed on the surface of the substrate. The pad stack comprises, for example, a pad oxide layer 404 and a polish stop layer 405. The polish stop layer serves as a polish or etch stop for subsequent processes and may comprise, for example, nitride. The pad stack also includes a hard mask layer 406, typically comprising TEOS. Other materials, such as BSG, are also useful for the hard mask layer. The hard mask layer is patterned using conventional lithographic techniques to define a region in which a trench 409 is formed. The trench 409 includes a collar 468 in the upper portion thereof.

Figure 4B:
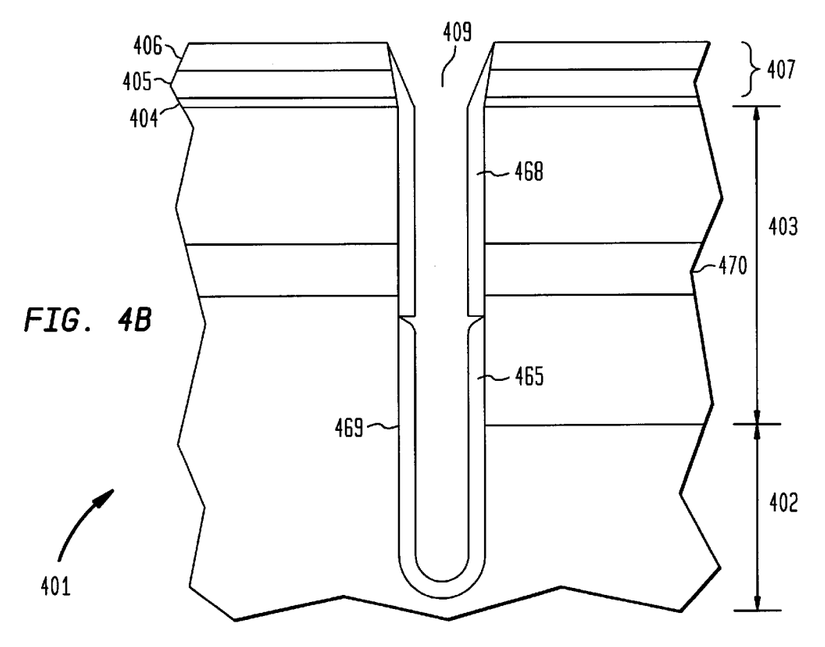

Referring to FIG. 4b, an epi layer 465 is deposited in the portion of the trench below the collar. The epi layer is doped with n-type dopants such as P or As. The epi layer, in one embodiment, is formed selective to the oxide. Such technique is referred to as selective epi growth (SEG). SEG is described in, for example, Wolf, *Silicon Processing for the VLSI Era*, Vol. 2, Lattice Press, 1990, which is herein incorporated by reference for all purposes. SEG forms the epi on exposed silicon. As a result, epi is formed on the exposed sidewalls in the lower portion of the trench while the collar and pad stack as a mask prevent epi growth thereon.

The epi layer is deposited, in one embodiment, by rapid thermal chemical vapor deposition (RTCVD). Other chemical vapor deposition techniques are also useful to deposit the epi layer. Various silicon sources or precursors, such as silicon tetrachloride ($SiCl_4$), dichlorosilane ($SiH_2Cl_2$), trichlorosilane ($SiHCl_3$), and silane ($SiH_4$) are useful for growing epi. Hydrogen ($H_2$) serves as a dilutant and Hydrogen Chloride (HCl) gas is used to enhance the selectivity of the epi growth.

In one embodiment, the epi layer is in-situ doped with dopants during epi growth. Insitu doped is achieved by flowing dopants into the reactor during growth. For example, $PH_3$ (P source) or $AsH_3$ (As source) is introduced into the reactor to provided a n-doped epi layer. A p-type epi layer may also be useful. $B_2H_6$ is used as the p-type dopant source for a p-type epi layer. Such, p-type epi layer may be useful with p-channel array devices. To achieve a sufficiently high growth rate of typically about 5–50 nm/min, the deposition temperature is between about 850–1050° C. Of course, the temperature can be varied to achieve a higher or lower growth rate as desired. Selectivity is controlled by varying HCl and $H_2$ flows and/or pressure during epi formation.

The dopant concentration of the buried plate depends of design requirements. For example, it is desirable to provide a highly doped buried plate that is thicker than the space charge region is desirable as it effectively prevents the current flow in the presence of a voltage bias. The dopant concentration is from about $1\times10^{18}$–$1\times10^{21}$. Typically, the dopant concentration is about $1\times10^{19}$–$1\times10^{20}$.

The thickness of the buried layer depends on design requirements and dopant concentration. Typically, the thickness is about 1–10 nm. The minimum required thickness of the epi layer is inversely related to the dopant concentration therein. The higher the concentration, the thinner the minimum required thickness is. Conversely, the lower the concentration, the thicker the minimum required thickness is. In the case of an epi layer with dopant concentration of about $4\times10^{19}$ $cm^{-3}$, the thickness of the plate is about 4 nm or greater. If the dopant concentration is decreased by a factor of 10, the thickness of the epi plate is about 40 nm or greater.

In some embodiments, an undoped or lightly doped (p−) epi spacer layer is provided between the substrate and more heavily doped epi buried plate. The epi spacer layer is particularly useful when a p+ substrate is employed. The spacer layer improves the separation of dopants between the n+ epi buried plate and the p+ substrate. The thickness of the spacer layer is, for example, about 1–10 nm.

Figure 4C:
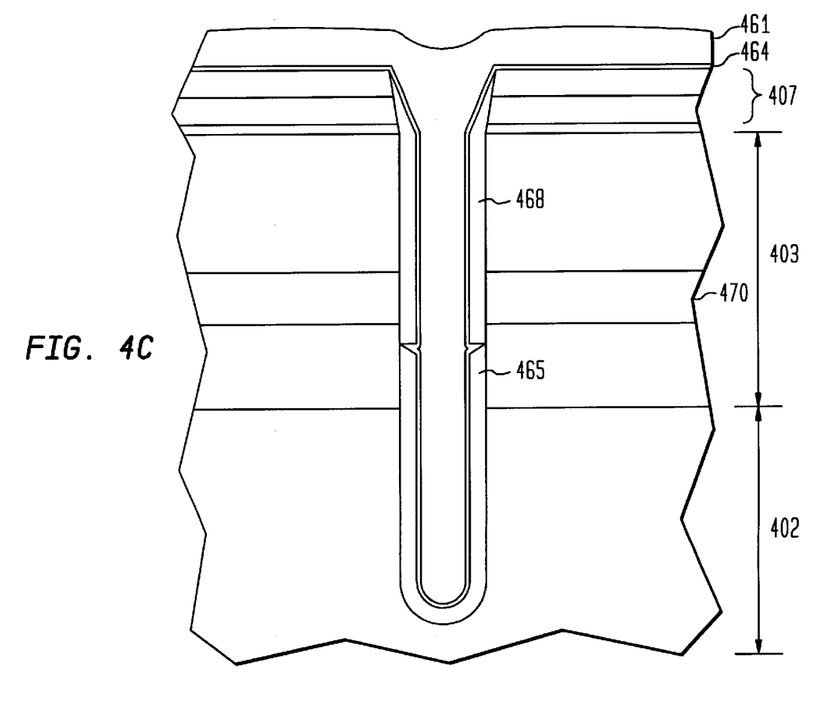

In FIG. 4c, a dielectric layer 464 is formed over the surface of the wafer, covering the interior of the trench including the collar and epi buried plate. The dielectric layer serves as the node dielectric, separating the electrodes of the capacitor. In one embodiment, the dielectric layer comprises a nitride/oxide (NO) film stack. The NO film stack is formed by, for example, depositing a nitride layer. CVD in an FTP tool may be used to deposit the nitride layer. Typically, the thickness of nitride layer is about 5 nm. The nitride layer is then oxidized at a temperature of about 900° C. to densify it. The oxidation process results in a NO layer having essentially the same or slightly increased thickness as the nitride layer. The use of a NO layer improves the quality of the node dielectric. Other dielectric film or film stacks such as oxide, oxynitride, oxide/nitride/oxide (ONO), oxide/nitride/oxide/nitride (ONON), or nitride/oxide/nitride/oxide (NONO) are also useful.

A poly layer 461 is deposited on the surface of the wafer, filling the trench and covering the pad stack. The poly is deposited by, for example, CVD. As shown, the poly is layer is conformal. The poly layer is insitu doped with n-type dopants, such as P and As. In one embodiment, the poly layer is doped with As. The concentration of As in the poly layer is about $1\times10^{19}$–$1\times10^{20}$ $cm^{-3}$. The doped poly serves as the node electrode of the capacitor.

Figure 4D:
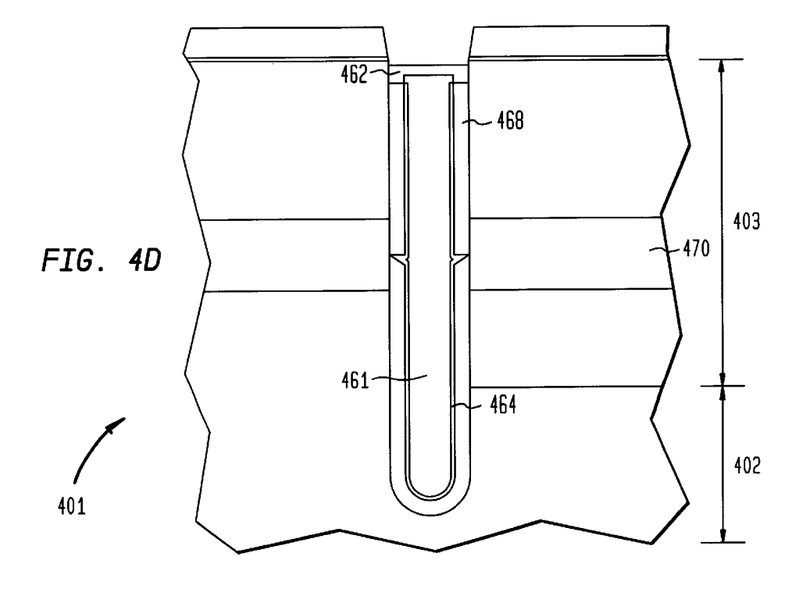

Referring to FIG. 4d, the poly layer is polished by chemical mechanical polishing (CMP). The pad stop layer 405 serves as a CMP stop layer, causing the polishing to stop once it reaches the nitride layer. As a result, excess poly that covers the pad stack (including the hard mask layer 406), leaving a substantially planar surface between the nitride layer 405 and trench poly for subsequent processing. In some embodiments, the hard mask is removed earlier in the process flow.

After the surface of the wafer is planarized, the doped poly 461 in the trench is recessed, by for example, reactive ion etching (RIE) to form the buried strap. In one embodiment, the poly is recessed to about 100 nm below the silicon surface. The recess exposes an upper portion of the collar 468. The exposed portion of the collar is removed, typically by a wet etch. The wet etch overetches the collar to recess it below the surface of the poly. Typically, the overetch recesses the collar about 50 nm below the poly.

A poly layer 462 is deposited on the substrate, covering the nitride layer and filling the recessed portion of the trench. Typically, the poly layer is an intrinsic or undoped poly layer. Amorphous silicon is also useful to fill the trench. Layer 462 may also be doped, depending on design requirements, to reduce resistivity. The poly layer is planarized down to the nitride layer. After planarization, the poly in the trench is recessed to, for example, about 50 nm below the surface of the substrate, forming the buried strap 462. In the example described above, the buried strap is about 10 nm thick. Of course, the various recesses can be optimized to result in a buried strap as specified by design requirements.

Figure 4E:
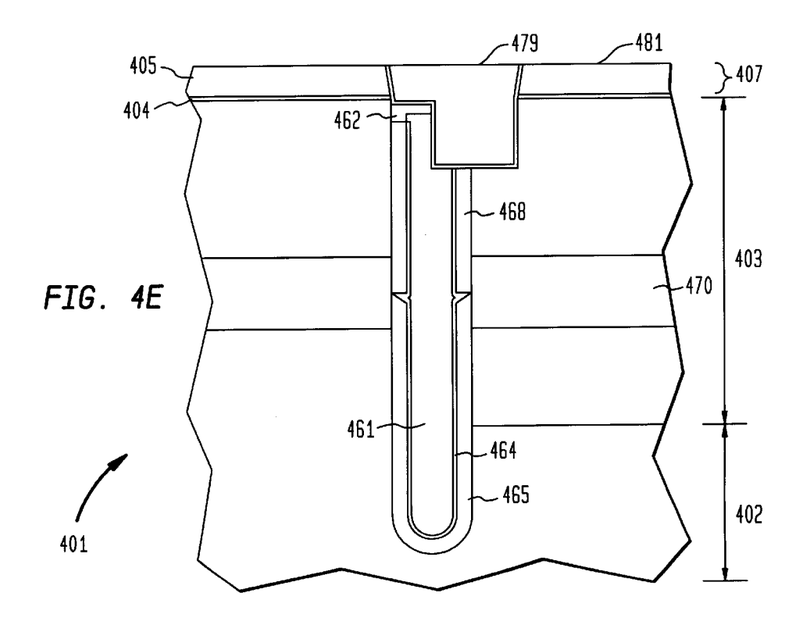

In FIG. 4e, the active area of the DRAM cell is defined. An anti-reflective coating (ARC) layer is deposited on the substrate surface, covering the nitride layer and strap. The ARC is used to improve the resolution of the lithographic process for defining the active area (AA). A resist layer is formed above the ARC layer, serving as an AA etch mask. The active region is then defined by conventional lithographic technique. The nonactive region of the cell is then anisotropically etched by, for example, RIE to form a shallow trench 479 therein. The nonactive region is the region where a STI is to be formed.

As shown, the nonactive region overlaps a portion of the trench, cutting off part of the strap. The overlap leaves a portion of the buried strap, allowing current to flow between the storage node and node junction. Typically, the STI overlaps about half the trench width. The depth of the STI is below the buried strap to prevent strap to strap leakage between adjacent cells. The depth of the STI is about 0.25 µm below the silicon surface.

After the non-active region is etched, the resist and ARC layers are removed. To ensure that no resist or ARC residues remain, clean steps may be employed. To prevent oxygen from diffusing into the silicon and poly sidewalls, a nitride liner 481 is provided to protect the nonactive region. Typically, a passivation oxide is thermally grown on the exposed silicon prior to forming the nitride liner. The nitride liner is formed by, for example low pressure chemical vapor deposition (LPCVD). The nitride liner is formed over the substrate surface, covering the nitride layer and nonactive STI region.

A dielectric material is formed on the surface of the substrate. The dielectric material, for example, comprises $SiO_2$. In one embodiment, the dielectric material is TEOS. The thickness of the dielectric layer sufficient to fill the nonactive region. The surface of the substrate is polished so that the top surfaces of the STI and the nitride are substantially planar.

Figure 4F:
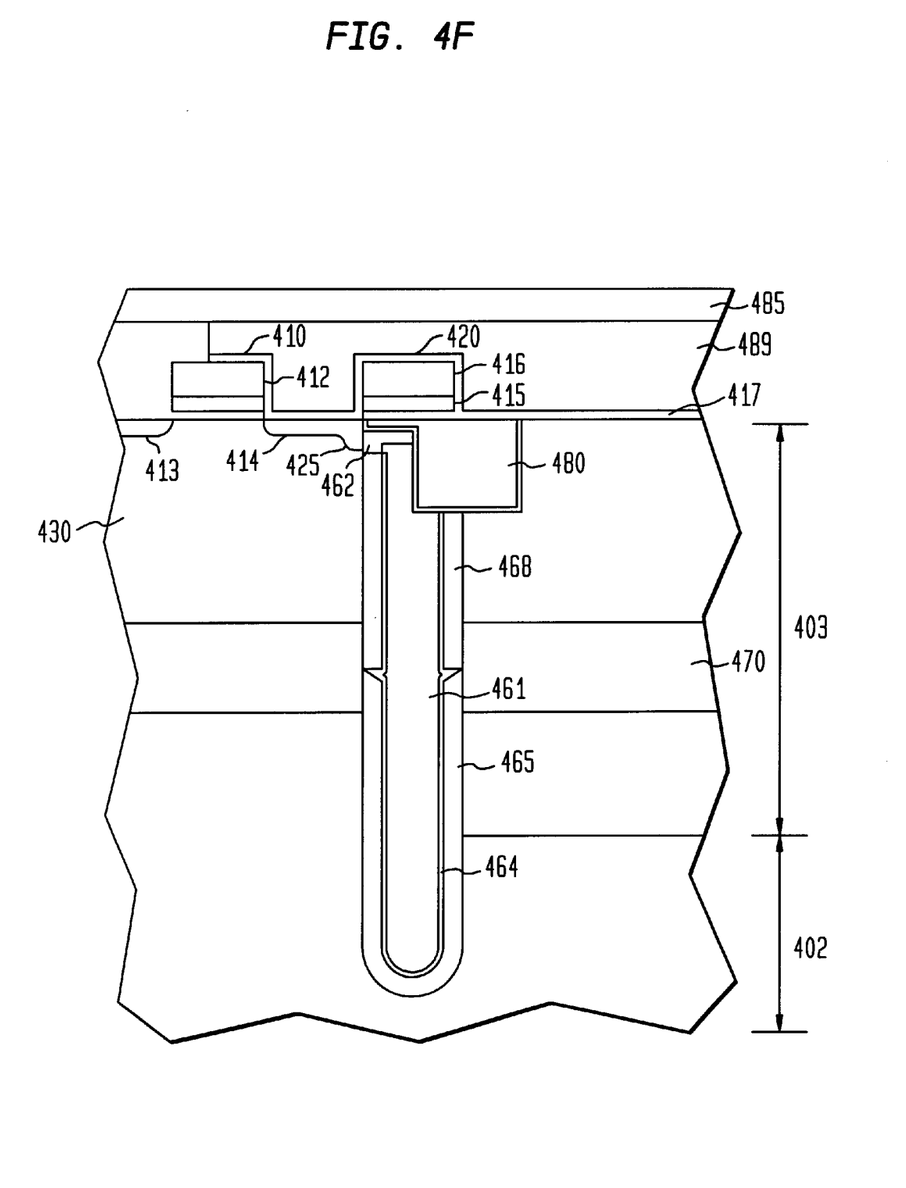

Referring to FIG. 4f, the pad nitride layer is then removed by, for example, a wet chemical etch. The wet chemical etch is selective to oxide. The pad oxide is also removed at this point by wet chemical etch selective to silicon. After removal of the pad oxide, an oxide layer is formed on the surface of the wafer. The oxide layer, referred to as a "gate sacrificial layer", serves as a screen oxide for subsequent implants.

To define a region for a p-type well 430 for the n-channel access transistor of the DRAM cell, a resist layer is deposited on top of the oxide layer and appropriately patterned to expose the p-well region. As shown, p-type dopants, such as boron (B) are implanted into the well region. The dopants are implanted sufficiently deep to prevent punchthrough and to reduce sheet resistance. The dopant profile is tailored to achieve the desired electrical characteristics, e.g., gate threshold voltage ($V_t$).

In addition, p-type wells for n-channel support circuitry are also formed. For complimentary wells in complimentary metal oxide silicon (CMOS) devices, n-type wells (n-wells) are formed. Additional lithographic and implant steps are required for defining and forming n-wells. As with the p-wells, the profile of the n-wells is tailored to achieve the desired electrical characteristics. After the wells have been formed, the gate sacrificial layer is removed.

A gate oxidation layer 411 is formed and patterned to cover the region where the transistor is to be formed. To form the transistor, layers such as poly 415 (which may include a silicide such as $Wsi_x$, where x=2–3), and nitride 416 are then formed over the surface of the substrate. These layers are then patterned to form a gate stack of a transistor 410 of the DRAM cell. A passing gate stack 420 is typically formed over the trench and isolated therefrom by the STI and oxide on top of the trench. Diffusion regions 413 and 414 are formed by implanting n-type dopants such as P or As. In one embodiment, P dopants are implanted into the source and drain regions. The dose and energy is chosen to produce a dopant profile to achieve the desired operating characteristics. To improve diffusion and alignment of the diffusion regions to the gate, nitride spacers (not shown) may be employed. To connect the transistor to the trench, a node junction 425 is created by outdiffusing dopants through the strap 462.

A dielectric layer 489 is formed over the wafer surface and planarized, covering the gates and substrate surface. The dielectric layer, for example, comprises BPSG. Other dielectric layer, such as TEOS is also useful. A liner layer 417 comprising nitride, for example, is formed prior to the dielectric layer 489 to serve as an etch stop for forming a borderless contact opening. As shown, the borderless contact opening 483 is etched to expose the diffusion region 413. The contact opening is then filled with a conductive material, such as n+ doped polysilicon or other conductive material, forming a contact stud therein. A metal layer, representing a bitline 485, is formed over the dielectric layer, making contact with the diffusion region via the contact stud.

Alternatively, a surface strap instead of a buried strap is used. The use of a surface strap does not require the recessing of the poly to form the buried strap as described above with FIG. 4d. Techniques for forming a surface strap to connect the capacitor with the transistor are well known and will not be described.

Figure 5A:
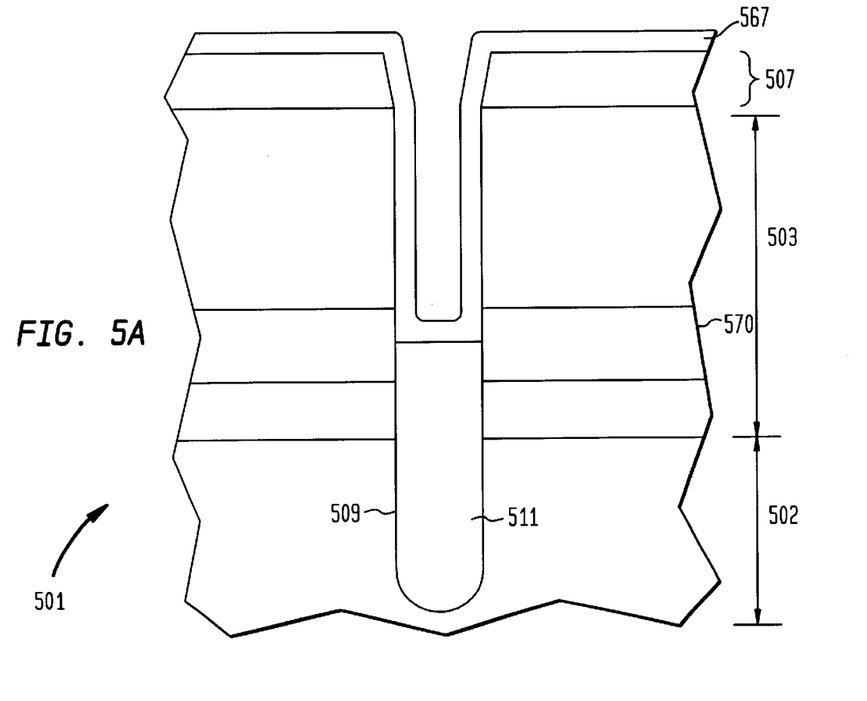
FIGS. 5a–c show a process for forming a collar in accordance with one embodiment of the invention.

FIGS. 5a–c show a process for forming the collar prior to forming the epi buried plate. Such process is described in a concurrently filed U.S. patent application U.S. Ser. No. 09/055,506, titled "TRENCH CAPACITOR WITH ISOLATION COLLAR" (attorney docket number 98 P 7491), which is herein incorporated by reference for all purposes. As shown in FIG. 5a, a semiconductor substrate 501 is provided. The substrate, for example, comprises silicon. In one embodiment, the substrate is an p–/p+ epi substrate (p– epi portion 503 and p+ substrate 502). Alternatively, the substrate is a p-substrate. Other types of substrates are also useful. The substrate includes a buried well 570. On the surface of the substrate is a pad stack 507 comprising various pad layers such as pad oxide, pad nitride and a hard mask layer. The pad stack is patterned to define a region in which a trench 509 is formed by RIE. The trench is filled with a sacrificial material 511, such as poly or amorphous silicon. Other sacrificial materials which are stable up to about 1050–1100° C. are also useful. The sacrificial material is recessed to a depth equal to the bottom of the collar.

A dielectric layer 567 is deposited, lining the sidewalls of the trench and surface of the sacrificial material. The dielectric layer comprises, for example, oxide to serve as the collar oxide. In one embodiment, the dielectric layer is formed by first growing a thin layer of thermal oxide, by depositing a layer of TEOS thereover. The thickness of the oxide is about, for example, 5–10 nm and the collar is about 20–50 nm thick. Alternatively, the dielectric layer comprises thermal oxide. A nitride liner may be formed over the dielectric layer. Other types of dielectric to serve as the collar are also useful.

Figure 5B:
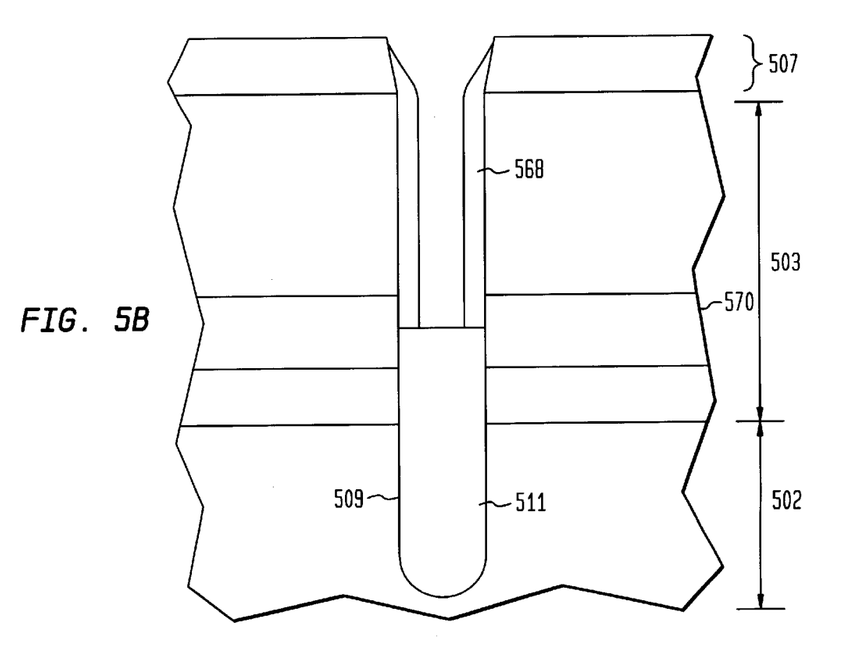

Referring to FIG. 5b, a collar open etch is performed to expose the sacrificial material 511. An anisotropic etch such as a RIE is used to open the collar. The RIE also removes the dielectric layer from the surface pad stack and bottom of opening 402, leaving the dielectric layer remaining on the silicon sidewall to form a collar 468. As depicted, the upper portion of the dielectric layer lining the trench sidewalls of opening 402 is tapered as a result of erosion from the RIE. However, since the collar will subsequently be recessed to below the substrate surface past the point of the taper, the taper does not adversely affect the functionality of the collar.

Figure 5C:
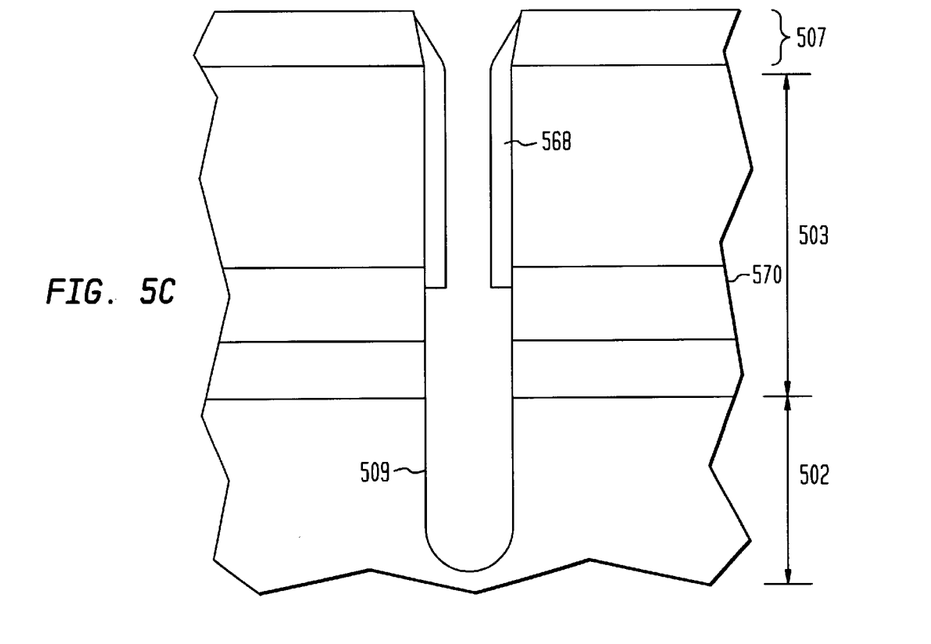

Referring to FIG. 5c, the sacrificial material 511 is removed by, for example, a wet etch to expose the trench sidewalls in the lower portion of the trench. The process continues as described in FIGS. 4a–f.

Alternatively, the collar can be formed by LOCOS oxidation. LOCOS oxidation techniques are described in, for example, U.S. Pat. No. 5,656,535, which is herein incorporated by reference for all purposes. In such techniques, a nitride layer is deposited after the trench is formed. The nitride layer lines the trench sidewalls. The nitride layer is sufficiently thick to protect the trench sidewalls from being oxidized. Typically, the nitride layer is about 50 A thick. Resist is then deposited and recessed to about the bottom of the collar, exposing the nitride layer in the upper portion of the trench. A wet etch removes the exposed nitride. The resist is removed, leaving the nitride layer lining the bottom portion of the trench. LOCOS oxidation is then employed to form the oxide collar in the exposed trench sidewalls in the upper portion of the trench. The thickness of the LOCOS collar is, for example, about 20–30 nm. The process continues as described in FIGS. 4a–f.

Figure 6A:
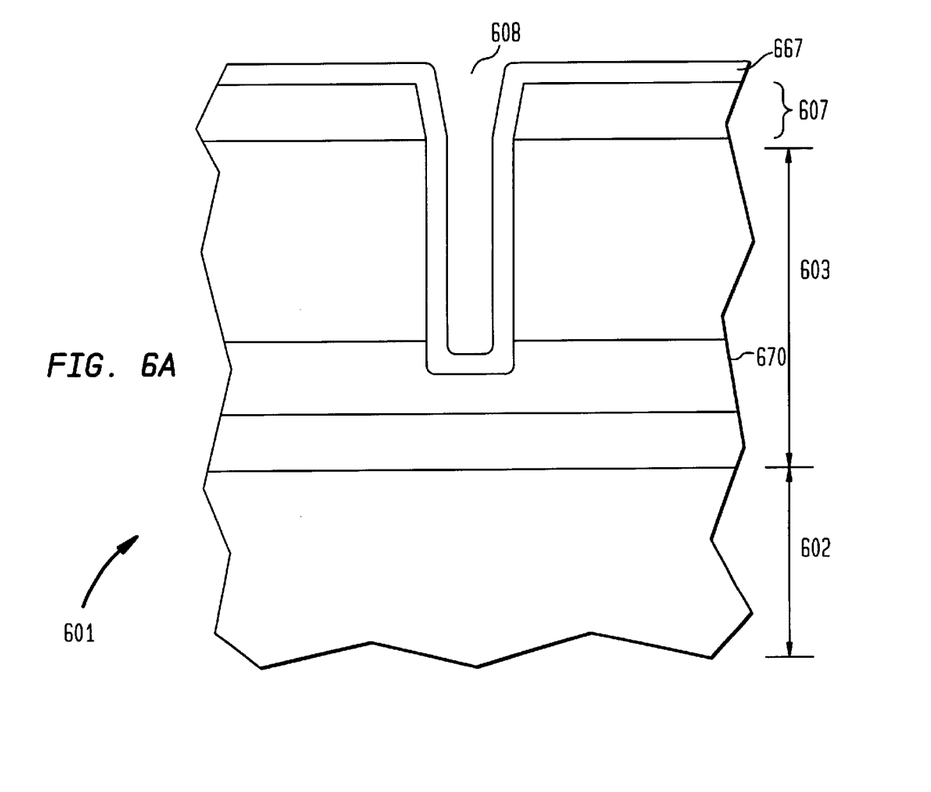
FIGS. 6a–c show another process for forming a collar in accordance with the invention.

FIGS. 6a–c show another process for forming the collar prior to forming the epi buried plate. As shown in FIG. 6a, a semiconductor substrate 601 is provided. The substrate, for example, comprises silicon. The substrate may be, for example, a p–/p+ epi substrate (p– epi portion 603 and p+ substrate portion 604). Other types of substrates, such as p-substrates, are also useful. The substrate includes a buried well 670. On the surface of the substrate is a pad stack 607 comprising various pad layers such as pad oxide, pad nitride and a hard mask layer. The pad stack is patterned to define a region in which a trench is formed by RIE.

The defined region is then etched by, for example, reactive ion etching (RIE), to form an opening in the pad stack to expose the substrate. The exposed substrate is etched to a depth that defines about the bottom of the collar, forming a trench 608. In one embodiment, the opening 608 is etched to a depth of about 1–1.5 μm. Of course, this depth varies depending on design requirements.

A dielectric layer 667 is deposited, lining the sidewalls of the trench and bottom the trench. The dielectric layer comprises, for example, oxide to serve as the collar oxide. In one embodiment, the dielectric layer is formed by first growing a thin layer of thermal oxide to a thickness of about 5–10 nm followed by depositing a layer of TEOS thereover. Typically, the collar is about 20–50 nm thick. Alternatively, the dielectric layer comprises thermal oxide. A nitride liner may be formed over the dielectric layer. Other types of dielectric to serve as the collar are also useful.

Figure 6B:
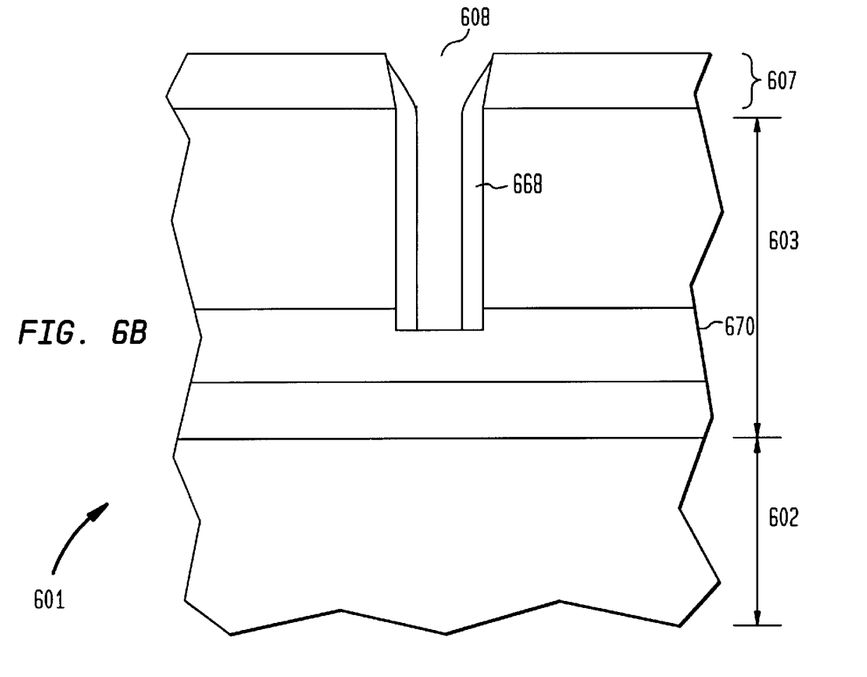

Referring to FIG. 6b, a collar open etch is performed to expose the substrate at the bottom surface of trench 608. An anisotropic etch such as a RIE is used to open the collar. The RIE also removes the dielectric layer from the surface pad stack and bottom of trench 608, leaving the dielectric layer remaining on the silicon sidewall to form a collar 668. As depicted, the upper portion of the dielectric layer lining the trench sidewalls of opening 608 is tapered as a result of erosion from the RIE. However, since the collar will subsequently be recessed to below the substrate surface past the point of the taper, the taper does not adversely affect the functionality of the collar.

Figure 6C:
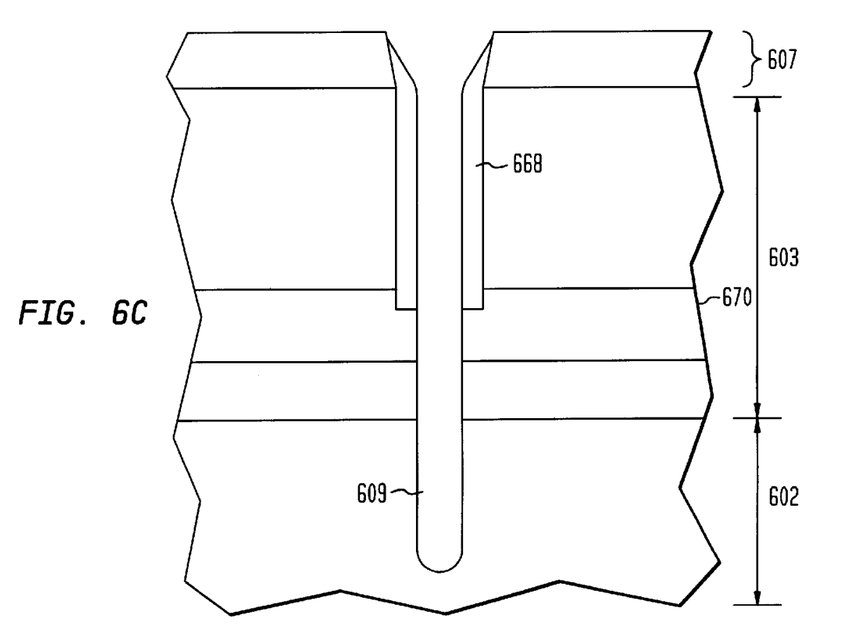

Referring to FIG. 6c, a RIE is performed. The RIE etches the exposed substrate surface at the bottom of trench, extending its depth. The RIE etches the substrate to form a bottom portion 669 of the trench 609. Typically, the trench is about 6–8 μm below the surface of the substrate. Of course the depth of the trench depends on design requirements as well as processing capabilities. The hard mask layer may be removed after the formation of the trench. Typically, the hard mask is removed by a wet etch. Alternatively, the hard mask may be removed later on in the process flow. The process continues as described in FIGS. 4a–f.

While the invention has been particularly shown and described with reference to various embodiments, it will be recognized by those skilled in the art that modifications and changes may be made to the present invention without departing from its scope. Merely by way of example, the trench capacitor may be formed with a surface strap as well as other cell or bitline configurations may be employed. The scope of the invention should therefore be determined not with reference to the above description but with reference to the appended claims along with their full scope of equivalents.

What is claimed is:

1. A semiconductor integrated circuit comprising:

a trench capacitor, wherein the trench capacitor comprises an epitaxial layer lining the lower portion of sidewalls of a trench below an oxide collar which lines an upper portion of the trench, the epitaxial layer abutting the oxide collar in the trench such that the oxide collar and the epitaxial layer do not overlap on the sidewalls of the trench.

2. The semiconductor integrated circuit as recited in claim 1, wherein the epitaxal layer is undoped.

3. The semiconductor integrated circuit as recited in claim 1, wherein the trench is filled with polysilicon, the polysilicon and the epitaxial layer including dopants of a same conductivity type.

4. The semiconductor integrated circuit as recited in claim 1, further comprising a continuous dielectric layer formed on the epitaxial layer and the oxide collar.

5. The semiconductor integrated circuit as recited in claim 1, wherein the trench capacitor is formed in a substrate, the substrate including a p–/p+ dopant substrate.

6. The semiconductor integrated circuit as recited in claim 1, wherein the epitaxial layer is buried.

7. The semiconductor integrated circuit as recited in claim 1, wherein the epitaxial layer includes polysilicon.

8. The semiconductor integrated circuit as recited in claim 1, wherein the epitaxial layer is comprised of a plurality of epitaxial layers.

* * * * *